(12) United States Patent
Ozeki

(10) Patent No.: US 10,954,416 B2
(45) Date of Patent: Mar. 23, 2021

(54) METHOD FOR MANUFACTURING CONNECTION STRUCTURE

(71) Applicant: DEXERIALS CORPORATION, Tokyo (JP)

(72) Inventor: Hiroki Ozeki, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 83 days.

(21) Appl. No.: 16/072,656

(22) PCT Filed: Feb. 21, 2017

(86) PCT No.: PCT/JP2017/006438
§ 371 (c)(1),
(2) Date: Jul. 25, 2018

(87) PCT Pub. No.: WO2017/163721
PCT Pub. Date: Sep. 28, 2017

(65) Prior Publication Data
US 2019/0002741 A1  Jan. 3, 2019

(30) Foreign Application Priority Data
Mar. 25, 2016  (JP) .............................. JP2016-061600

(51) Int. Cl.
*C09J 9/02* (2006.01)
*C09J 11/04* (2006.01)
(Continued)

(52) U.S. Cl.
CPC . *C09J 9/02* (2013.01); *C09J 4/00* (2013.01); *C09J 5/06* (2013.01); *C09J 11/04* (2013.01);
(Continued)

(58) Field of Classification Search
CPC ......... C09J 9/02; C09J 4/00; C09J 5/06; C09J 11/04; C09J 163/00; C09J 201/00; H01R 4/04; H05K 3/323
See application file for complete search history.

(56) References Cited

U.S. PATENT DOCUMENTS 6,284,086 B1 * 9/2001 Cardellino .......... B29C 65/1687
156/273.7
6,498,051 B1 * 12/2002 Watanabe .............. H05K 3/323
438/106
(Continued)

FOREIGN PATENT DOCUMENTS

JP          06102523 A  *  4/1994
JP       H06-102523 A     4/1994
(Continued)

OTHER PUBLICATIONS

Translation of JP-2013220578-A (Year: 2013).*
(Continued)

*Primary Examiner* — Daniel McNally
(74) *Attorney, Agent, or Firm* — Oliff PLC

(57) ABSTRACT

A method for manufacturing a connection structure capable of increasing the allowable range of a spacing between terminals of a component and mounting at a low temperature. The method for manufacturing a connection structure includes a disposition step of disposing, through an anisotropic conductive adhesive of a thermosetting type including conductive particles, a first electronic component including a first terminal row and a second electronic component including a second terminal row facing the first terminal row, a thermal pressurization step of thermally pressurizing the first electronic component and the second electronic component to sandwich the conductive particles between the first terminal row and the second terminal row, and a full curing step of irradiating with infrared laser light to fully cure the anisotropic conductive adhesive in a state where the conductive particles are sandwiched between the first terminal row and the second terminal row.

11 Claims, 4 Drawing Sheets

(51) Int. Cl.
   *C09J 4/00*      (2006.01)
   *H05K 3/32*     (2006.01)
   *H01R 4/04*     (2006.01)
   *C09J 201/00*  (2006.01)
   *C09J 5/06*      (2006.01)
   *C09J 163/00*  (2006.01)
   *C08K 3/04*     (2006.01)
   *H05K 1/14*     (2006.01)
   *H05K 3/36*     (2006.01)

(52) U.S. Cl.
   CPC ........... *C09J 163/00* (2013.01); *C09J 201/00* (2013.01); *H01R 4/04* (2013.01); *H05K 3/323* (2013.01); *C08K 3/04* (2013.01); *C08K 2201/001* (2013.01); *C09J 2203/326* (2013.01); *C09J 2301/416* (2020.08); *C09J 2463/00* (2013.01); *H05K 1/144* (2013.01); *H05K 3/361* (2013.01); *H05K 2201/0323* (2013.01); *H05K 2201/042* (2013.01); *H05K 2203/107* (2013.01)

(56) References Cited

U.S. PATENT DOCUMENTS

| | | | |
|---|---|---|---|
| 7,144,471 | B2 | 12/2006 | Kobayashi et al. |
| 2010/0193961 | A1* | 8/2010 | Konishi ............... C08L 63/00 257/773 |
| 2012/0055703 | A1* | 3/2012 | Ishimatsu ............ H05K 3/361 174/257 |
| 2014/0001419 | A1 | 1/2014 | Namiki et al. |

FOREIGN PATENT DOCUMENTS

| | | | |
|---|---|---|---|
| JP | H09-260820 | A | 10/1997 |
| JP | 2000-182691 | A | 6/2000 |
| JP | 2006-253665 | A | 9/2006 |
| JP | 2008-216891 | A | 9/2008 |
| JP | 2010-199527 | A | 9/2010 |
| JP | 2013-220578 | A | 10/2013 |
| JP | 2013220578 | A * | 10/2013 |
| JP | 2014-102943 | A | 6/2014 |
| JP | 2014102943 | A * | 6/2014 |
| KR | 10-0382759 | B1 | 5/2003 |
| KR | 10-2014-0019349 | A | 2/2014 |
| TW | 552651 | B | 9/2003 |
| WO | 00/45431 | A1 | 8/2000 |

OTHER PUBLICATIONS

Translation of JP-06102523-A (Year: 1994).*
Translation of JP-2014102943-A (Year: 2014).*
May 9, 2017 Search Report issued in International Patent Application No. PCT/JP2017/006438.
Oct. 8, 2019 Office Action issued in Japanese Patent Application No. 10-2018-7024766.
Oct. 11, 2018 International Preliminary Report on Patentability issued in International Patent Application No. PCT/JP2017/006438.
Aug. 25, 2020 Office Action issued in Chinese Patent Application No. 201780015466.0.
Jul. 3, 2020 Office Action issued in Taiwanese Patent Application No. 106106643.

* cited by examiner

METHOD FOR MANUFACTURING CONNECTION STRUCTURE

TECHNICAL FIELD

The present art relates to a method for manufacturing a connection structure including connecting electronic components to each other. In particular, the present art relates to a method for manufacturing a connection structure by using infrared laser light. The present application claims priority on the basis of JP 2016-061600 filed on Mar. 25, 2016 in Japan, and this application is incorporated into the present application by reference.

BACKGROUND ART

In recent years, in association with a fine pitch and thickness reduction of electronic components, mounting at a low temperature for suppressing warp, alignment shifting, and the like has been demanded in anisotropic conductive connection using an anisotropic conductive film. For example, Patent Literatures 1 and 2 propose, as a technique for mounting at a low temperature, heating an anisotropic conductive film by using infrared laser light to melt or soften the anisotropic conductive film, and then curing the anisotropic conductive film.

However, when the anisotropic conductive film is melted or cured by using infrared laser light, a temperature of the anisotropic conductive film abruptly increases. Thus, the allowable range of a spacing between terminals of a component decreases, and it becomes necessary to design viscosity of a binder and the like depending on a spacing between terminals of a component and the like.

CITATION LIST

Patent Literature

Patent Literature 1: JP 2006-253665 A
Patent Literature 2: JP 2013-220578 A

SUMMARY OF INVENTION

Technical Problem

The present art is to solve the above-described problems, and provides a method for manufacturing a connection structure capable of increasing the allowable range of a spacing between terminals of a component and mounting at a low temperature.

Solution to Problem

The present inventor of the present art has intensively studied, and as a result, has found that conductive particles are sandwiched between terminal rows by thermal pressurization and an anisotropic conductive adhesive is fully cured by using an infrared laser, and accordingly, the allowable range of a spacing between terminals of a component can be increased, and mounting at a low temperature can be achieved.

That is, a method for manufacturing a connection structure according to the present art includes a disposition step of disposing, through an anisotropic conductive adhesive of a thermosetting type including conductive particles, a first electronic component including a first terminal row and a second electronic component including a second terminal row facing the first terminal row, a thermal pressurization step of thermally pressurizing the first electronic component and the second electronic component to sandwich the conductive particles between the first terminal row and the second terminal row, and a full curing step of irradiating with infrared laser light to fully cure the anisotropic conductive adhesive in a state where the conductive particles are sandwiched between the first terminal row and the second terminal row.

Advantageous Effects of Invention

According to the present art, since conductive particles are sandwiched between terminal rows by thermal pressurization and then, an anisotropic conductive adhesive is fully cured by using an infrared laser, the allowable range of a spacing between terminals of a component can be increased, and mounting at a low temperature can be achieved.

BRIEF DESCRIPTION OF DRAWINGS

FIG. 1A illustrates a step of temporarily fixing a flexible substrate on an anisotropic conductive film. FIG. 1B illustrates a step of fully compression bonding a rigid substrate to the flexible substrate by heat. FIG. 1C illustrates a state of a mounted body obtained after the full compression bonding.

FIG. 2A illustrates a compression bonding state of the component having a large spacing between terminals. FIG. 2B illustrates a compression bonding state of a component having a small spacing between terminals.

FIG. 3A illustrates a compression bonding state of the component having a small spacing between terminals. FIG. 3B illustrates a compression bonding state of the component having a large spacing between terminals.

FIG. 4A illustrates a disposition step. FIG. 4B illustrates a thermal pressurization step. FIG. 4C illustrates a full curing step.

DESCRIPTION OF EMBODIMENTS

Hereinafter, embodiments of the present art will be described in detail in the following order.
1. Method for Manufacturing Connection Structure
2. Examples

1. Method for Manufacturing Connection Structure

Figure 1A:
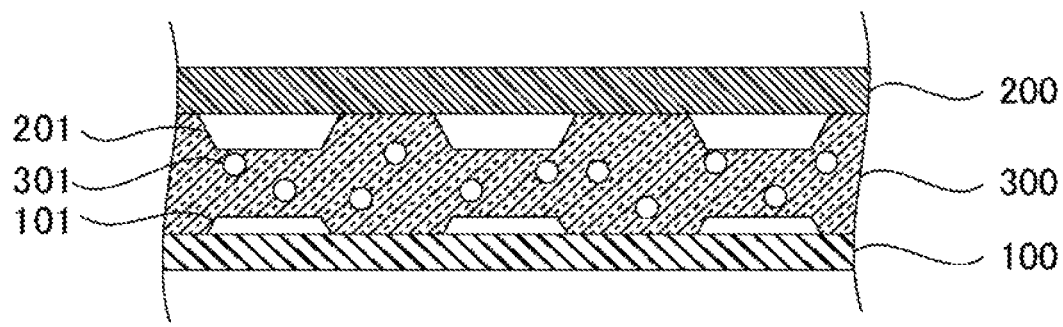
FIGS. 1A to 1C are cross-sectional views schematically illustrating a known mounting method using thermocompression bonding.
Figure 1B:
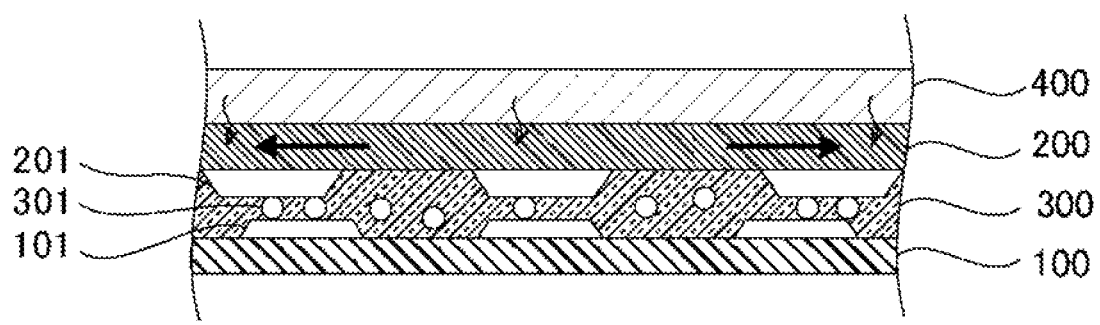
Figure 1C:
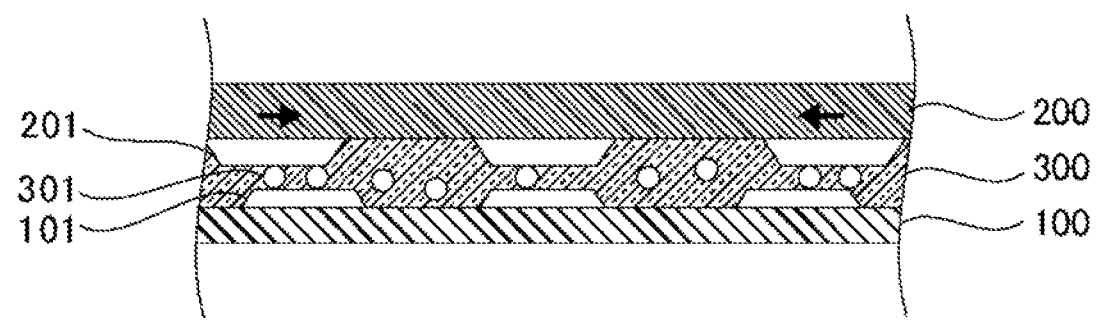

FIGS. 1A to 1C are cross-sectional views schematically illustrating a known mounting method using thermocompression bonding. FIG. 1A illustrates a step of temporarily fixing a flexible substrate on an anisotropic conductive film. FIG. 1B illustrates a step of fully compression bonding a rigid substrate to the flexible substrate by heat. FIG. 1C illustrates a state of a mounted body obtained after the full compression bonding.

As illustrated in FIG. 1A, a flexible substrate 200 is temporarily fixed on an anisotropic conductive film 300 bonded onto a rigid substrate 100. As illustrated in FIG. 1B, heat is then applied to the anisotropic conductive film 300 by a thermal pressurization tool 400 to cure the anisotropic conductive film 300. When the anisotropic conductive film 300 is cured by the thermal pressurization tool 400, the flexible substrate 200 is stretched by expansion due to heat, and furthermore, as illustrated in FIG. 1C, after radiation of heat, shrinkage of the flexible substrate 200 is hindered by the anisotropic conductive film 300 cured. Thus, alignment of terminals 101 of the rigid substrate 100 and terminals 201 of the flexible substrate 200 becomes difficult. In particular, as the spacing between the terminals reduces or a compression bonding temperature increases, the alignment becomes more difficult.

Figure 2A:
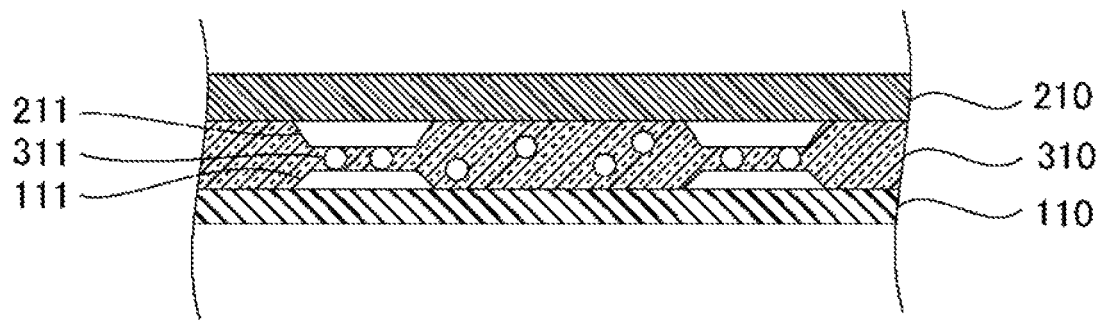
FIGS. 2A and 2B are cross-sectional views schematically illustrating a known mounting method using an anisotropic conductive film designed for a component having a large spacing between terminals.
Figure 2B:
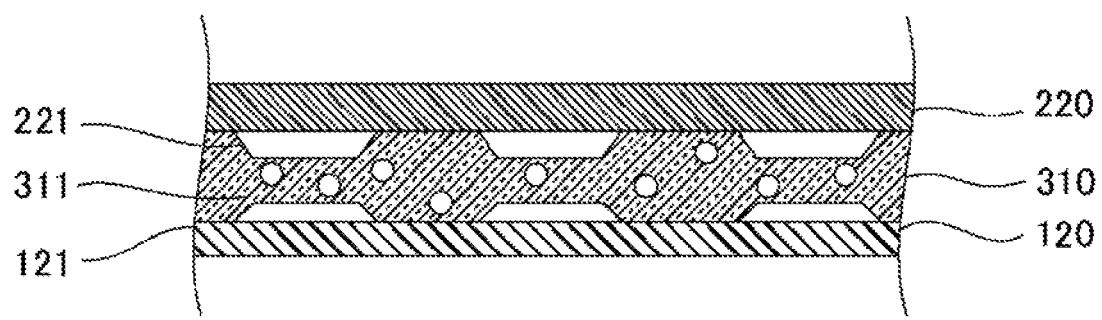
Figure 3A:
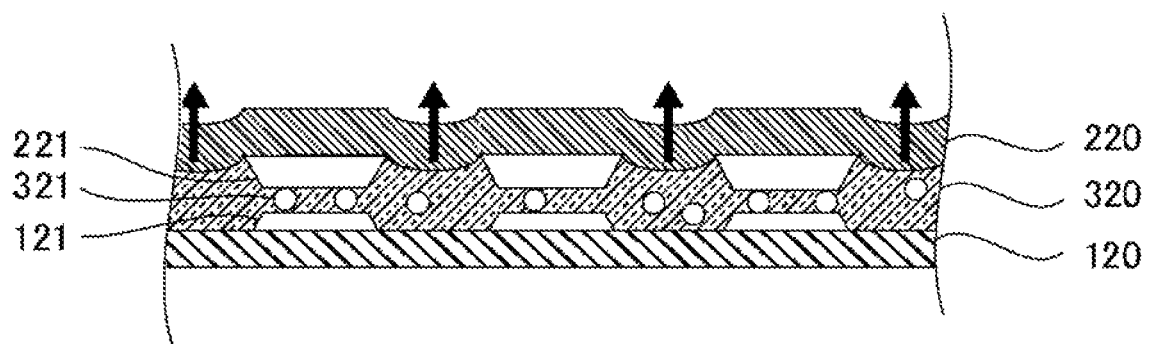
FIGS. 3A and 3B are cross-sectional views schematically illustrating a known mounting method using an anisotropic conductive film designed for a component having a small spacing between terminals.
Figure 3B:
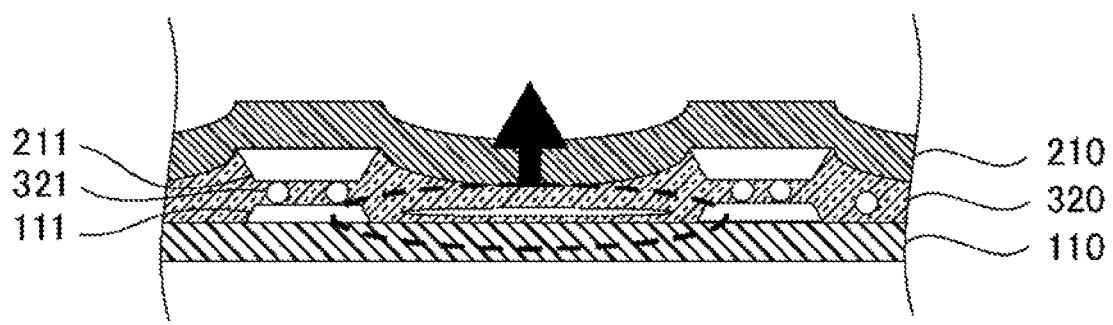

FIGS. 2A and 2B are cross-sectional views schematically illustrating a known mounting method using an anisotropic conductive film designed for a component having a large spacing between terminals. FIG. 2A illustrates a compression bonding state of the component having a large spacing between terminals. FIG. 2B illustrates a compression bonding state of a component having a small spacing between terminals. Furthermore, FIGS. 3A and 3B are cross-sectional views schematically illustrating a conventional mounting method using an anisotropic conductive film designed for a component having a small spacing between terminals. FIG. 3A illustrates a compression bonding state of the component having a small spacing between terminals. FIG. 3B illustrates a compression bonding state of the component having a large spacing between terminals.

In general, in the case of a component having a large spacing between terminals, an anisotropic conductive film 310 is designed to have high viscosity. Thus, in the case of a rigid substrate 110 and a flexible substrate 210 each having a large spacing between terminals as illustrated in FIG. 2A, no problem occurs. In the case of a rigid substrate 120 and a flexible substrate 220 each having a small spacing between terminals as illustrated in FIG. 2B, since the anisotropic conductive film 310 has high viscosity, insufficient pushing occurs.

Furthermore, in general, in the case of a component having a small spacing between terminals, an anisotropic conductive film 320 is designed to have low viscosity. Thus, in the case of the rigid substrate 120 and the flexible substrate 220 each having a small spacing between terminals as illustrated in FIG. 3A, no problem occurs. In the case of the rigid substrate 110 and the flexible substrate 210 each having a large spacing between terminals as illustrated in FIG. 3B, since the anisotropic conductive film 320 has low viscosity, pushing becomes easy and components are peeled off each other by repulsion due to excess pushing at the time of completion of compression bonding. The peeling is caused by repulsion due to excess compression of conductive particles or by an insufficient amount of a resin filling a space between terminals due to excess pushing.

Figure 4A:
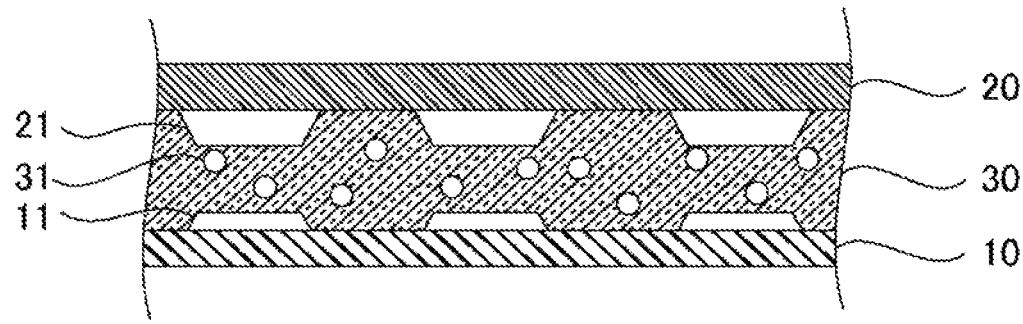
FIGS. 4A to 4C are cross-sectional views schematically illustrating a method for manufacturing a connection structure according to the present embodiment.
Figure 4B:
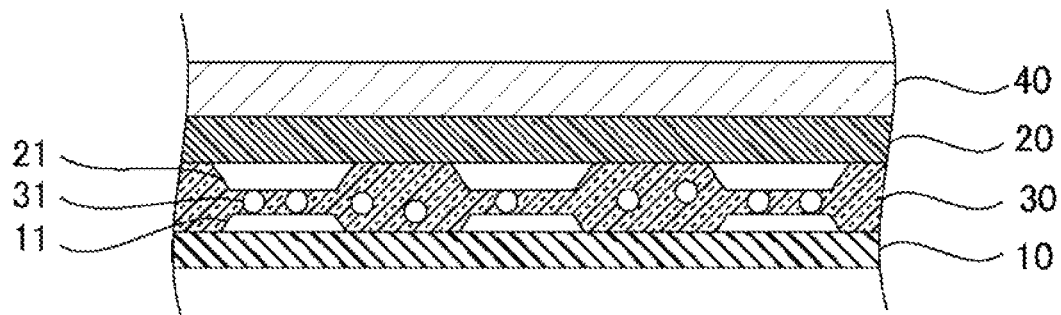
Figure 4C:
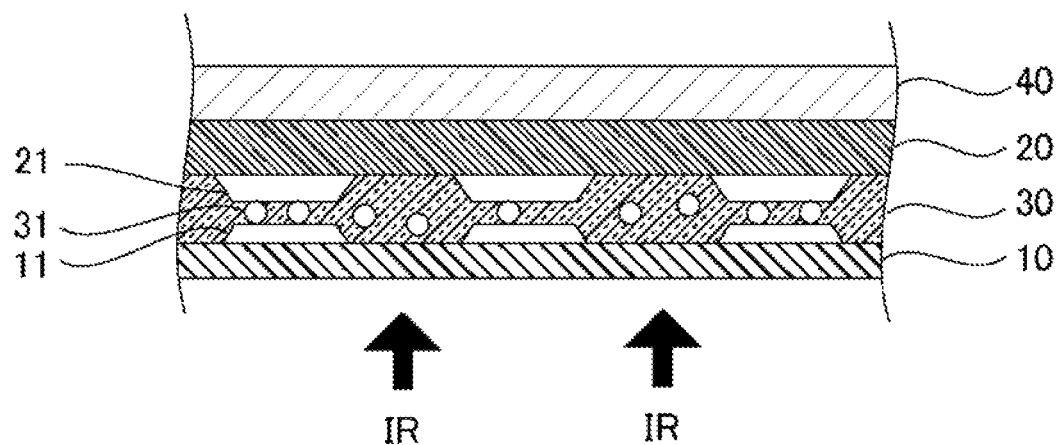

FIGS. 4A to 4C are cross-sectional views schematically illustrating a method for manufacturing a connection structure according to the present embodiment. FIG. 4A illustrates a disposition step. FIG. 4B illustrates a thermal pressurization step. FIG. 4C illustrates a full curing step.

The method for manufacturing a connection structure according to the present embodiment includes a disposition step (S1) of disposing, through a anisotropic conductive adhesive 30 of a thermosetting type including conductive particles 31, a first electronic component 10 including a first terminal row and a second electronic component 20 including a second terminal row 21 facing the first terminal row 11, a thermal pressurization step (S2) of thermally pressurizing the first electronic component 10 and the second electronic component 20 to sandwich the conductive particles 31 between the first terminal row 11 and the second terminal row 21, and a full curing step (S3) of irradiating with infrared laser light to fully cure the anisotropic conductive adhesive 30 in a state where the conductive particles 31 are sandwiched between the first terminal row 11 and the second terminal row 21.

According to the present embodiment, since a temperature in the thermal pressurization step (S2) is relatively low, thermal expansion of the second electronic component 20 can be suppressed. In the thermal pressurization step (S2), thermal pressurization time is set according to the viscosity of the anisotropic conductive adhesive 30, and accordingly, excess or insufficient pushing can be suppressed, and furthermore, the allowable range of a spacing between terminals of each of the first electronic component 10 and the second electronic component 20 can be increased.

Furthermore, the anisotropic conductive adhesive 30 preferably contains a film-forming resin having a glass transition temperature (Tg) or a softening point of from 40 to 100° C., a polymerizable compound, a polymerization initiator having a reaction initiation temperature of from 100° C. to 150° C., and an infrared absorber absorbing infrared laser light to generate heat, and the anisotropic conductive adhesive 30 preferably has a lowest melt viscosity of not higher than 10000 Pa·s. Accordingly, in the method for manufacturing a connection structure according to the present embodiment, excellent conduction resistance can be achieved.

Hereinafter, the disposition step (S1), the thermal pressurization step (S2), and the full curing step (S3) will be described.

Disposition Step (S1)

In the disposition step (S1), the first electronic component 10 including the first terminal row 11 and the second electronic component 20 including the second terminal row 21 facing the first terminal row 11 are disposed through the anisotropic conductive adhesive 30 of a thermosetting type including the conductive particles 31.

The first electronic component 10 and the second electronic component 20 are not particularly limited and can be selected appropriately in accordance with a purpose. Examples of the first electronic component 10 include a transparent substrate and a Printed Wiring Board (PWB) for applications of a Flat-Panel Display (FPD) such as a Liquid Crystal Display (LCD) panel and an Organic EL Display (OLED), and applications of a touch panel. A material for the printed wiring board is not particularly limited. For example, glass epoxy such as a FR-4 base material may be used, or plastic such as a thermoplastic resin, ceramic, or the like can also be used. Furthermore, the transparent substrate is not particularly limited as long as the transparent substrate has high transparency. Examples of the transparent substrate include a glass substrate and a plastic substrate. Furthermore, examples of the second electronic component 20 include a Flexible Printed Circuit (FPC), a Tape Carrier Package (TCP) substrate, an Integrated Circuit (IC), and a Chip On Film (COF) including an IC mounted on an FPC.

The anisotropic conductive adhesive 30 may include a thermosetting anisotropic conductive adhesive, or may include a thermosetting anisotropic conductive adhesive used in combination with a photocurable anisotropic conductive adhesive. Furthermore, the anisotropic conductive adhesive 30 may include any of an Anisotropic Conductive Film (ACF) in a film form and an Anisotropic Conductive Paste (ACP) in a paste form. The anisotropic conductive film is preferable from the viewpoint of easy handling. The anisotropic conductive paste is preferable from the viewpoint of a cost. Furthermore, a polymerization type of the anisotropic conductive adhesive 30 may include any of a cationic polymerization type, an anionic polymerization type, and a radical polymerization type. Furthermore, a cationic polymerization-type anisotropic conductive adhesive, an anionic polymerization-type anisotropic conductive adhesive, and a radical polymerization-type anisotropic conductive adhesive may be used in combination as long as there is no particular hindrance. Examples of the polymerization-type anisotropic conductive adhesives used in combination include the cationic polymerization-type anisotropic conductive adhesive used in combination with the radical polymerization-type anisotropic conductive adhesive.

Hereinafter, the radical polymerization-type anisotropic conductive adhesive will be described as an example. The radical polymerization-type anisotropic conductive adhesive contains a film-forming resin, a radical polymerizable compound, a polymerization initiator, and conductive particles.

The film-forming resin corresponds to a high-molecular-weight resin having a weight average molecular weight of not less than 10000, for example, and the weight average molecular weight is preferably from approximately 10000 to approximately 80000 from the viewpoint of film formability. Examples of the film-forming resin include various resins such as a phenoxy resin, an epoxy resin, a polyester resin, a polyurethane resin, a polyester urethane resin, an acrylic resin, a polyimide resin, and a butyral resin. These resins may be used alone, or two or more types thereof may be used in combination.

A glass transition temperature (Tg) or a softening point of the film-forming resin is preferably from 40 to 100° C., and more preferably from 50 to 90° C. Accordingly, in the thermal pressurization step (S2), excellent flow characteristics can be obtained even by thermal pressurization at a relatively low temperature. Specific examples of a commercially available film-forming resin can include trade name "jER-4004P" available from Mitsubishi Chemical Corporation and trade name "YP-50" and "YP-70" available from Nippon Steel Chemical Co., Ltd. Note that the softening point can be measured by a softening point test (ring and ball) method (measurement condition: in accordance with JIS-2817).

The radical polymerizable compound includes a polymerizable compound having an acrylate residue or a methacrylate residue (hereinafter referred to as a (meth)acrylate residue) in a molecule. A radical polymerizable compound appropriately selected from (meth)acrylate monomers used in the field of adhesives and the like can be used. Note that herein, (meth)acrylate includes acrylate and methacrylate.

Examples of the radical polymerizable compound include polyethylene glycol di(meth)acrylate, urethane (meth)acrylate, phosphate type (meth)acrylate, tricyclodecane dimethanol di(meth)acrylate, 2-hydroxyethyl (meth)acrylate, 2-hydroxypropyl (meth)acrylate, 4-hydroxybutyl (meth)acrylate, isobutyl (meth)acrylate, t-butyl (meth)acrylate, and isooctyl (meth)acrylate. Among these, polyethylene glycol diacrylate that is bifunctional (meth)acrylate, urethane acrylate, or ethylene oxide modified phosphate dimethacrylate that is phosphate type acrylate can preferably be used from the viewpoint of improving cohesion strength of a cured product, improving conduction reliability, and improving adhesiveness. Specific examples of a commercially available radical polymerizable compound can include trade name "A-200" available from Shin Nakamura Chemical Co., Ltd., "U-2PPA" available from Shin Nakamura Chemical Co., Ltd., and trade name "PM-2" available from NIPPON KAYAKU Co., Ltd.

Examples of the polymerization initiator include an organic peroxide and an azo compound. Examples of the organic peroxide include a diacyl peroxide compound, a peroxy ester compound, a hydroperoxide compound, a peroxydicarbonate compound, a peroxy ketal compound, a dialkyl peroxide compound, and a ketone peroxide compound. Among these, a diacyl peroxide compound can preferably be used.

Furthermore, a reaction initiation temperature of the polymerization initiator is preferably equal to or greater than a temperature used during pressurization in the thermal pressurization step (S2), and more specifically the reaction initiation temperature is preferably from 100° C. to 150° C. Here, the reaction initiation temperature means a half-life temperature for one minute of the organic peroxide. Specific examples of a commercially available polymerization initiator can include trade name "PEROYL L" available from NOF Corporation and trade name "NYPER BW" available from NOF Corporation.

Further, the binder may include, as necessary, acrylic rubber, a monomer for dilution including various types of acrylic monomers, a filler, a softening agent, a colorant, a flame retardant, a thixotropic agent, a silane coupling agent, or the like compounded as another component in accordance with a purpose.

As the conductive particles 31, known conductive particles used in an anisotropic conductive film can be used. Examples of the conductive particles 31 include particles made from various types of metals or metal alloys such as nickel, iron, copper, aluminum, tin, lead, chromium, cobalt, silver, and gold, particles made by coating surfaces of particles made from a metal oxide, carbon, graphite, glass, ceramic, plastic, or the like with a metal, and particles made by further coating surfaces of such particles with an insulating thin film. In the case of the particles made by coating the surfaces of the resin particles with a metal, particles made from, for example, an epoxy resin, a phenol resin, an acrylic resin, an Acrylonitrile-Styrene (AS) resin, a benzoguanamine resin, a divinylbenzene-based resin, or a styrene-based resin can be used as the resin particles.

An average particle diameter of the conductive particles 31 is usually from 1 to 30 μm, preferably from 2 to 20 μm, and more preferably from 2.5 to 15 μm. Furthermore, average particle density of the conductive particles in the binder resin is preferably from 100 to 100000 particles/mm$^2$, and more preferably from 500 to 80000 particles/mm$^2$ from the viewpoint of connection reliability and insulation reliability.

Furthermore, the conductive particles 31 may be dispersed in an electrically insulating resin, may each be present independently in a film plan view, or may be present in any disposition. When the conductive particles are disposed, number density, a distance between the conductive particles, and the like can be set according to a size and a layout of an electrode to be anisotropically connected. Thus, an effect on capture improvement, short circuit suppression, and the like is achieved, and a cost reduction effect such as yield improvement is also expected.

Furthermore, the anisotropic conductive adhesive 30 preferably contains an infrared absorber absorbing infrared laser light to generate heat. As the infrared absorber, insulating-coated conductive particles made by subjecting conductive particles to insulating coating, carbon black, titanium black, a metal oxide, or the like can be used. Among these, the insulating-coated conductive particles are preferably used, and the insulating-coated conductive particles are more preferably used in combination with carbon black.

The insulating-coated conductive particles preferably each include a surface coated with an electrically insulating resin layer being made of an electrically insulating resin having a carboxyl group and being surface-treated with a polyfunctional aziridine compound. Accordingly, solvent resistance of the insulating-coated conductive particles can be improved without impairing thermoplasticity of the electrically insulating resin layer.

Furthermore, an average particle diameter of the insulating-coated conductive particles is preferably smaller than the average particle diameter of the conductive particles. Accordingly, sandwiching the insulating-coated conductive particles between the first terminal row 11 and the second terminal row 21 can be suppressed. Furthermore, the average particle diameter of the insulating-coated conductive particles is smaller than the average particle diameter of the conductive particles, and accordingly, even when the insulating-coated conductive particles are sandwiched between the first terminal row 11 and the second terminal row 21, the electrically insulating resin layer is melted by heat of infrared laser light, and thus, an increase in conduction resistance can be prevented.

Such insulating-coated conductive particles can be obtained by coating a surface of each of the conductive particles with an electrically insulating resin by an ordinary method, and spraying the surface with a solution of a polyfunctional aziridine compound (for example, an ethanol solution) followed by drying and heating at from 80 to 140° C. Furthermore, the insulating-coated conductive particles can be obtained by adding the conductive particles coated with the electrically insulating resin to the solution of a polyfunctional aziridine compound, and heating the solution at from 30 to 80° C. with stirring. As the conductive particles used for the insulating-coated conductive particles, known conductive particles used in the above-described anisotropic conductive film can be used. Furthermore, an example of the electrically insulating resin having a carboxyl group can include an electrically insulating resin having an acrylic acid monomer unit and a methacrylic acid monomer unit.

Furthermore, the anisotropic conductive film may include, as necessary, acrylic rubber, a monomer for dilution including various types of acrylic monomers, a filler, a softening agent, a colorant, a flame retardant, a thixotropic agent, a silane coupling agent, or the like compounded as another component in accordance with a purpose.

A lowest melt viscosity of the anisotropic conductive adhesive 30 is preferably not greater than 10000 Pa·s, and more preferably not greater than 6000 Pa·s. Furthermore, a lowest melt viscosity attainment temperature is preferably not lower than 50° C. and not higher than 120° C., and preferably not lower than 60° C. and not higher than 100° C. Accordingly, the first electronic component 10 and the second electronic component 20 each including a terminal row at any pitch of not greater than 1000 μm can be mounted. As an example of a method for measuring the lowest melt viscosity, a measurement plate having a diameter of 8 mm can be used to measure the lowest melt viscosity by using a rotary rheometer (available from TA Instruments), and constantly keeping a temperature increasing rate of 10° C./min and a measurement pressure of 5 g.

Furthermore, the glass transition temperature or the softening point of the film-forming resin is preferably lower than the reaction initiation temperature of the polymerization initiator. Accordingly, excellent flow characteristics can be obtained in the thermal pressurization step (S2).

Thermal Pressurization Step (S2)

In the thermal pressurization step (S2), the first electronic component 10 and the second electronic component 20 are thermally pressurized to sandwich the conductive particles 31 between the first terminal row 11 and the second terminal row 21. In the thermal pressurization step (S2), the pressing is preferably performed at a temperature of not lower than 50° C. and not higher than 120° C., and more preferably at a temperature of not lower than 70° C. and not higher than 110° C. by using a thermal pressurization tool 40. The thermal pressurization is performed in such a temperature range, and accordingly, influence of heat on the first electronic component 10 and the second electronic component 20 can be suppressed. Furthermore, thermal pressurization time is set according to a spacing between terminals of a component and the viscosity of the anisotropic conductive adhesive 30, and accordingly, excess or insufficient pushing due to flowing of the anisotropic conductive adhesive 30 can be suppressed.

Full Curing Step (S3)

In the full curing step (S3), infrared laser light-irradiation is performed to fully cure the anisotropic conductive adhesive 30 in a state where the conductive particles 31 are sandwiched between the first terminal row 11 and the second terminal row 21. In the full curing step (S3), the anisotropic conductive adhesive 30 is preferably fully cured to obtain a reaction ratio of the anisotropic conductive adhesive 30 of not less than 70%. The reaction ratio of the anisotropic conductive adhesive 30 is not less than 70%, and accordingly, excellent conduction resistance can be obtained.

As the infrared laser, a $CO_2$ laser, a YAG laser, a $YVO_4$ laser, a fiber laser, or the like can be used. As a wavelength of the infrared laser light, the range of from 700 nm to 1200 nm can be used. A laser output (W), a frequency (kHz), pulse energy (mJ), a focal distance (mm), a scanning rate (mm/sec), a scanning distance (mm), and the like can be set based on a size of the anisotropic conductive adhesive 31, an infrared light transmittance of a component, and the like.

Note that an infrared laser light-irradiation direction is not particularly limited as long as the anisotropic conductive adhesive can be irradiated with the infrared laser light. For example, when a large adhesion area is present as in a large panel, the anisotropic conductive adhesive may be irradiated while the infrared laser is moved or rotated (swung). Furthermore, a plurality of irradiation devices may be present. Furthermore, when an electronic component does not transmit infrared light and cannot be irradiated with infrared laser light from an upper side or a lower side, the irradiation may be performed in a diagonal direction relative to the anisotropic conductive adhesive (bonding portion). The irradiation in a diagonal direction means that an irradiation device is not present immediately above or immediately below the bonding portion of the electronic component and irradiation is performed in a diagonal direction relative to the bonding portion of the electronic component. Furthermore, the irradiation device may be present in the same plane as the bonding portion of the electronic component. From the viewpoint of efficiency of the step, the irradiation device is preferably present at a position other than the same plane as the bonding portion of the electronic component.

Furthermore, when a buffer material is used between the thermal pressurization tool 40 and the second electronic component 20 and infrared laser light-irradiation is performed from below a stage on which the first electronic component is placed, a buffer material having a low transmittance of infrared laser light, such as silicone rubber (thickness: from 200 to 450 μm, wavelength: 808 nm, transmittance: 0%) and a layered body of silicone rubber and polyimide (for example, thickness: 300 μm (polyimide: 50 μm, silicone rubber: 250 μm), wavelength: 808 nm, transmittance: 0%) is preferably used. Accordingly, the buffer material absorbs or generates heat by infrared laser light, and heat transfer of infrared light can be improved.

Furthermore, when a buffer material transmitting infrared laser light, such as polytetrafluoroethylene (thickness: from 50 to 150 μm, wavelength: 808 nm, transmittance: from 15 to 20%), polyimide (thickness: 50 μm, wavelength: 808 nm, transmittance: from 75 to 80%), and glass cloth (thickness: 50 μm, wavelength: 808 nm, transmittance: from 20 to 25%) is used, the buffer material may transmit infrared laser light.

Furthermore, in the above-described embodiment, the anisotropic conductive adhesive of a thermosetting type is fully cured by infrared laser light. However, the present art is not limited to the above-described embodiment. A thermosetting and photocurable anisotropic conductive adhesive may be used and may be cured fully by using infrared laser light and ultraviolet light in combination.

EXAMPLES

2. Examples

Hereinafter, Examples of the present art will be described, and the present art is not limited to these Examples.

2.1 First Example

In First Example, a Flexible Printed Circuit (FPC) and a Printed Wiring Board (PWB) were connected through an Anisotropic Conductive Film (ACF) to produce a connection structure, and conduction resistance was evaluated.

As the FPC, a base material for evaluation (Cu wiring (8 μmt-Sn plating), 38 μmt-S'perflex base material) including terminals at a pitch (L/S=1/1) of 200 μm, 600 μm, or 1000 μm was prepared.

As the PWB, a base material for evaluation (Cu wiring (35 μmt-Au plating), FR-4 base material, thickness: 1 mm) including terminals at a pitch (L/S=1/1) of 200 μm, 600 μm, or 1000 μm was prepared.

As the ACF, an anisotropic conductive adhesive composition A of a thermosetting type having a lowest melt viscosity of 800 Pa·s and an anisotropic conductive adhesive composition B of a thermosetting type having a lowest melt viscosity of 6000 Pa·s were prepared.

45 Parts of a bisphenol F-type epoxy resin (trade name jER-4004P available from Mitsubishi Chemical Corporation, softening point: 85° C.), 15 parts of a bisphenol A/F-type epoxy type phenoxy resin (trade name YP-70 available from Nippon Steel Chemical Co., Ltd., softening point: 70° C.), 20 parts of a bifunctional acrylic monomer (trade name A-200 available from Shin Nakamura Chemical Co., Ltd.), 20 parts of urethane acrylate (trade name U-2PPA available from Shin Nakamura Chemical Co., Ltd.), 4 parts of phosphate acrylate (trade name PM-2 available from NIPPON KAYAKU Co., Ltd.), 5 parts of a silica filler (particle diameter: 5 μm), 5 parts of a dilauroyl peroxide (trade name PEROYL L available from NOF Corporation), and 3 parts of nickel particles having an average particle diameter of 10 μm were uniformly mixed by an ordinary method to prepare the anisotropic conductive adhesive composition A. The anisotropic conductive adhesive composition A was applied to a releasable polyester film, and dried by spraying hot air of 70° C. for 5 minutes to produce an anisotropic conductive film A having a thickness of 30 μm.

45 Parts of a bisphenol A-type epoxy type phenoxy resin (trade name YP-50 available from Nippon Steel Chemical Co., Ltd., softening point: 83° C.), 20 parts of a bifunctional acrylic monomer (trade name A-200 available from Shin Nakamura Chemical Co., Ltd.), 20 parts of urethane acrylate (trade name U-2PPA available from Shin Nakamura Chemical Co., Ltd.), 4 parts of phosphate acrylate (trade name PM-2 available from NIPPON KAYAKU Co., Ltd.), 5 parts of a silica filler (particle diameter: 5 μm), 5 parts of a dilauroyl peroxide (trade name PEROYL L available from NOF Corporation), and 3 parts of nickel particles having an average particle diameter of 10 μm were uniformly mixed by an ordinary method to prepare the anisotropic conductive adhesive composition B. The anisotropic conductive adhesive composition B was applied to a releasable polyester film, and dried by spraying hot air of 70° C. for 5 minutes to produce an anisotropic conductive film B having a thickness of 30 μm.

Measurement of Lowest Melt Viscosity

The ACFs were superposed on one another to produce a sheet having a thickness of 300 μm. Subsequently, lowest melt viscosity was measured by using a melt viscosity meter (available from Thermo Fisher Scientific Inc.) under conditions of a temperature increasing rate of 10° C./min, a frequency of 1 Hz, an applied pressure of 1 N, and a measurement temperature range of from 30 to 180° C. As a result, the lowest melt viscosity of the anisotropic conductive adhesive composition A was 800 Pa·s and the lowest melt viscosity attainment temperature was 89° C. The lowest melt viscosity of the anisotropic conductive adhesive composition B was 6000 Pa·s and the lowest melt viscosity attainment temperature was 87° C.

Evaluation of Conduction Resistance

A conduction resistance value of a mounted body was measured at a current of 1 mA by using a digital multimeter (available from Yokogawa Electric Corporation) by a four-terminal method. When the conduction resistance value of the mounted body was less than 0.3Ω, the conduction resistance was evaluated as "A". When the conduction resistance value of the mounted body was not less than 0.3Ω and less than 0.6Ω, the conduction resistance was evaluated as "B". When the conduction resistance value of the mounted body was not less than 0.6Ω and less than 1.0Ω, the conduction resistance was evaluated as "C". When the conduction resistance value of the mounted body was not less than 1.0Ω, the conduction resistance was evaluated as "D".

Example 1

The anisotropic conductive film A cut into a slit having a width of 2.0 mm was bonded to a PWB including a terminal row at a pitch of 200 μm, and an FPC including a terminal row at a pitch of 200 μm was aligned on the anisotropic conductive film A. Then, thermal pressurization was performed through silicone rubber (release-treated) having a thickness of 250 μm as a buffer material by using a 2.0-mm width heating tool under conditions of a temperature of 100° C., a pressure of 3 MPa, and 1 second, and then irradiation with infrared laser light having a center wavelength of 940 nm was performed from a PWB side for 2 seconds to cure a binder and produce a mounted body. A laser output of the infrared laser was 40 W. Evaluation results of conduction resistance of the mounted body are shown in Table 1.

Example 2

A mounted body was produced in the same manner as in Example 1 except that a PWB and an FPC each including a terminal row at a pitch of 600 μm were used. Evaluation results of conduction resistance of the mounted body are shown in Table 1.

Example 3

A mounted body was produced in the same manner as in Example 1 except that a PWB and an FPC each including a terminal row at a pitch of 1000 μm were used. Evaluation results of conduction resistance of the mounted body are shown in Table 1.

Example 4

A mounted body was produced in the same manner as in Example 1 except that thermal pressurization was performed under conditions of a temperature of 100° C., a pressure of 3 MPa, and 2 seconds. Evaluation results of conduction resistance of the mounted body are shown in Table 1.

Example 5

A mounted body was produced in the same manner as in Example 1 except that a PWB and an FPC each including a terminal row at a pitch of 600 μm were used and thermal pressurization was performed under conditions of a temperature of 100° C., a pressure of 3 MPa, and 2 seconds. Evaluation results of conduction resistance of the mounted body are shown in Table 1.

Example 6

A mounted body was produced in the same manner as in Example 1 except that a PWB and an FPC each including a terminal row at a pitch of 1000 μm were used and thermal pressurization was performed under conditions of a temperature of 100° C., a pressure of 3 MPa, and 2 seconds. Evaluation results of conduction resistance of the mounted body are shown in Table 1.

Example 7

A mounted body was produced in the same manner as in Example 1 except that thermal pressurization was performed under conditions of a temperature of 100° C., a pressure of 3 MPa, and 3 seconds. Evaluation results of conduction resistance of the mounted body are shown in Table 1.

Example 8

A mounted body was produced in the same manner as in Example 1 except that a PWB and an FPC each including a terminal row at a pitch of 600 μm were used and thermal pressurization was performed under conditions of a temperature of 100° C., a pressure of 3 MPa, and 3 seconds. Evaluation results of conduction resistance of the mounted body are shown in Table 1.

Example 9

A mounted body was produced in the same manner as in Example 1 except that a PWB and an FPC each including a terminal row at a pitch of 1000 μm were used and thermal pressurization was performed under conditions of a temperature of 100° C., a pressure of 3 MPa, and 3 seconds. Evaluation results of conduction resistance of the mounted body are shown in Table 1.

Example 10

A mounted body was produced in the same manner as in Example 1 except that the anisotropic conductive film B was used. Evaluation results of conduction resistance of the mounted body are shown in Table 1.

Example 11

A mounted body was produced in the same manner as in Example 1 except that the anisotropic conductive film B was used and a PWB and an FPC each including a terminal row at a pitch of 600 μm were used. Evaluation results of conduction resistance of the mounted body are shown in Table 1.

Example 12

A mounted body was produced in the same manner as in Example 1 except that the anisotropic conductive film B was used and a PWB and an FPC each including a terminal row at a pitch of 1000 μm were used. Evaluation results of conduction resistance of the mounted body are shown in Table 1.

Example 13

A mounted body was produced in the same manner as in Example 1 except that the anisotropic conductive film B was used and thermal pressurization was performed under conditions of a temperature of 100° C., a pressure of 3 MPa, and 2 seconds. Evaluation results of conduction resistance of the mounted body are shown in Table 1.

Example 14

A mounted body was produced in the same manner as in Example 1 except that the anisotropic conductive film B, and a PWB and an FPC each including a terminal row at a pitch of 600 μm were used and thermal pressurization was performed under conditions of a temperature of 100° C., a pressure of 3 MPa, and 2 seconds. Evaluation results of conduction resistance of the mounted body are shown in Table 1.

Example 15

A mounted body was produced in the same manner as in Example 1 except that the anisotropic conductive film B, and a PWB and an FPC each including a terminal row at a pitch of 1000 μm were used and thermal pressurization was performed under conditions of a temperature of 100° C., a pressure of 3 MPa, and 2 seconds. Evaluation results of conduction resistance of the mounted body are shown in Table 1.

Example 16

A mounted body was produced in the same manner as in Example 1 except that the anisotropic conductive film B was used and thermal pressurization was performed under conditions of a temperature of 100° C., a pressure of 3 MPa, and 3 seconds. Evaluation results of conduction resistance of the mounted body are shown in Table 1.

Example 17

A mounted body was produced in the same manner as in Example 1 except that the anisotropic conductive film B, and a PWB and an FPC each including a terminal row at a pitch of 600 μm were used and thermal pressurization was performed under conditions of a temperature of 100° C., a pressure of 3 MPa, and 3 seconds. Evaluation results of conduction resistance of the mounted body are shown in Table 1.

Example 18

A mounted body was produced in the same manner as in Example 1 except that the anisotropic conductive film B, and a PWB and an FPC each including a terminal row at a pitch of 1000 μm were used and thermal pressurization was performed under conditions of a temperature of 100° C., a pressure of 3 MPa, and 3 seconds. Evaluation results of conduction resistance of the mounted body are shown in Table 1.

Comparative Example 1

The anisotropic conductive film A cut into a slit having a width of 2.0 mm was bonded to a PWB including a terminal row at a pitch of 200 μm, and an FPC including a terminal row at a pitch of 200 μm was aligned on the anisotropic conductive film A. Then, thermocompression bonding was performed through silicone rubber having a thickness of 250 μm as a buffer material by using a 2.0-mm width heating tool under conditions of a temperature of 170° C., a pressure of 3 MPa, and 5 seconds to produce a mounted body. Evaluation results of conduction resistance of the mounted body are shown in Table 2.

Comparative Example 2

A mounted body was produced in the same manner as in Comparative Example 1 except that a PWB and an FPC each including a terminal row at a pitch of 600 μm were used. Evaluation results of conduction resistance of the mounted body are shown in Table 2.

Comparative Example 3

A mounted body was produced in the same manner as in Comparative Example 1 except that a PWB and an FPC each including a terminal row at a pitch of 1000 μm were used. Evaluation results of conduction resistance of the mounted body are shown in Table 2.

Comparative Example 4

A mounted body was produced in the same manner as in Comparative Example 1 except that the anisotropic conductive film B was used. Evaluation results of conduction resistance of the mounted body are shown in Table 2.

Comparative Example 5

A mounted body was produced in the same manner as in Comparative Example 1 except that the anisotropic conductive film B was used and a PWB and an FPC each including a terminal row at a pitch of 600 μm were used. Evaluation results of conduction resistance of the mounted body are shown in Table 2.

Comparative Example 6

A mounted body was produced in the same manner as in Comparative Example 1 except that the anisotropic conductive film B was used and a PWB and an FPC each including a terminal row at a pitch of 1000 μm were used. Evaluation results of conduction resistance of the mounted body are shown in Table 2.

Comparative Example 7

The anisotropic conductive film A cut into a slit having a width of 2.0 mm was bonded to a PWB having a pitch of 200 μm, and an FPC having a pitch of 200 μm was aligned on the anisotropic conductive film A. Then, while compression bonding was performed through silicone rubber having a thickness of 250 μm as a buffer material by using a 2.0-mm width heating tool under conditions of a pressure of 3 MPa, irradiation with infrared laser light having a center wavelength of 940 nm was performed from a PWB side for 5 second to cure a binder and produce a mounted body. A laser output of the infrared laser was 40 W. Evaluation results of conduction resistance of the mounted body are shown in Table 2.

Comparative Example 8

A mounted body was produced in the same manner as in Comparative Example 7 except that a PWB and an FPC each including a terminal row at a pitch of 600 μm were used. As shown in Table 2, conduction resistance of the mounted body was evaluated as C.

Comparative Example 9

A mounted body was produced in the same manner as in Comparative Example 7 except that a PWB and an FPC each including a terminal row at a pitch of 1000 μm were used. Evaluation results of conduction resistance of the mounted body are shown in Table 2.

Comparative Example 10

A mounted body was produced in the same manner as in Comparative Example 7 except that the anisotropic conductive film B was used. Evaluation results of conduction resistance of the mounted body are shown in Table 2.

Comparative Example 11

A mounted body was produced in the same manner as in Comparative Example 7 except that the anisotropic conductive film B was used and a PWB and an FPC each including a terminal row at a pitch of 600 μm were used. Evaluation results of conduction resistance of the mounted body are shown in Table 2.

Comparative Example 12

A mounted body was produced in the same manner as in Comparative Example 7 except that the anisotropic conductive film B was used and a PWB and an FPC each including a terminal row at a pitch of 1000 μm were used. Evaluation results of conduction resistance of the mounted body are shown in Table 2.

TABLE 1

|  |  | Examples 1 to 9 | | | Examples 10 to 18 | | |
|---|---|---|---|---|---|---|---|
| Lowest melt viscosity (Pa · s) | | 800 | | | 6000 | | |
| Thermocompression bonding time (sec) | | 1 | 2 | 3 | 1 | 2 | 3 |
| Infrared laser light (sec) | | | 2 | | | | |
| Evaluation of conduction resistance | 200 μmP | A | A | A | C | B | A |
|  | 600 μmP | A | A | A | B | A | A |
|  | 1000 μmP | A | A | B | A | A | B |

TABLE 2

|  |  | Comparative Examples 1 to 3 | Comparative Examples 4 to 6 | Comparative Examples 7 to 9 | Comparative Examples 10 to 12 |
|---|---|---|---|---|---|
| Lowest melt viscosity (Pa · s) | | 800 | 6000 | 800 | 6000 |
| Mounting conditions | | 170° C.-3 MPa-5 sec | | 3 MPa-IR 5 sec | |
| Evaluation of conduction resistance | 200 μmP | A | D | A | D |
|  | 600 μmP | B | B | C | C |
|  | 1000 μmP | D | A | D | A |

In the case of mounting by known thermocompression bonding as in Comparative Examples 1 to 6, it was difficult to mount the PWB and the FPC each including a terminal row at a pitch of from 200 μm to 1000 μm by using the anisotropic conductive film A or the anisotropic conductive B.

Furthermore, in the case of mounting by infrared laser light as in Comparative Examples 7 to 12, it was difficult to mount the PWB and the FPC each including a terminal row at a pitch of from 200 μm to 1000 μm by using the anisotropic conductive film A or the anisotropic conductive film B.

On the other hand, as in Examples 1 to 18, the conductive particles were sandwiched between terminal rows by thermal pressurization and the anisotropic conductive film A or the anisotropic conductive film B was fully cured by infrared laser light, and accordingly, the PWB and the FPC each including a terminal row at a pitch of from 200 μm to 1000 μm were able to be mounted at a low temperature.

2.2 Second Example

In Second Example, a Flexible Printed Circuit (FPC) and a glass substrate were connected through an Anisotropic Conductive Film (ACF) to produce a connection structure, and a reaction ratio, conduction resistance, and adhesion strength were evaluated.

As the FPC, a base material for evaluation (Cu wiring (8 μmt-Sn plating), 38 μmt-S'perflex base material) having a pitch (L/S=1/1) of 50 μm was prepared.

As the glass substrate, a base material for evaluation (the entire surface coated with ITO, glass thickness: 0.7 mm) of ITO-coating glass was prepared.

Production of Mounted Body

The ACF cut into a slit having a width of 1.5 mm was bonded to the glass substrate, and the FPC was temporarily fixed on the ACF. Then, thermal pressurization was performed through a polytetrafluoroethylene sheet (release-treated) having a thickness of 150 μm as a buffer material by using a 1.5-mm width heating tool under conditions of a temperature of 100° C., a pressure of 4.5 MPa, and 2 seconds, and then irradiation with infrared laser light having a center wavelength of 940 nm was performed from a glass substrate side for 2 seconds to cure a binder and produce a mounted body. A laser output of the infrared laser was 30 W.

Evaluation of Conduction Resistance

A conduction resistance value of the mounted body was measured at a current of 1 mA by using a digital multimeter (available from Yokogawa Electric Corporation) by a four-terminal method. When the conduction resistance value of the mounted body was less than 0.3Ω, the conduction resistance was evaluated as "A". When the conduction resistance value of the mounted body was not less than 0.3Ω and less than 0.6Ω, the conduction resistance was evaluated as "B". When the conduction resistance value of the mounted body was not less than 0.6Ω, the conduction resistance was evaluated as "C".

Evaluation of Adhesion Strength

Adhesion strength used during pulling of the FPC from the mounted body was measured by using a tensile tester (product number: RTC1201 available from A&D Company, Limited) at a measurement rate of 50 mm/sec. When an adhesion strength value of the mounted body was not less than 6 N/cm, the adhesion strength was evaluated as "A". When the adhesion strength value of the mounted body was not less than 5 N/cm and less than 6 N/cm, the adhesion strength was evaluated as "B". When the adhesion strength value of the mounted body was less than 5 N/cm, the adhesion strength was evaluated as "C".

Evaluation of Reaction Ratio

Calorific values of the ACF generated before and after the compression bonding were measured by using a Differential Scanning calorimetry (DSC), and a reaction ratio was measured from a decrease ratio of the calorific values generated before and after the compression bonding. When the reaction ratio of the ACF was not less than 80%, the reaction ratio was evaluated as "A". When the reaction ratio was not less than 70% and less than 80%, the reaction ratio was evaluated as "B". When the reaction ratio was less than 70%, the reaction ratio was evaluated as "C".

Example 19

In an adhesive containing 45 parts of a bisphenol F-type epoxy resin (trade name jER-4004P available from Mitsubishi Chemical Corporation, softening point: 85° C.), 15 parts of a bisphenol A/F-type epoxy type phenoxy resin (trade name YP-70 available from Nippon Steel Chemical Co., Ltd., glass transition temperature: 74° C.), 20 parts of a bifunctional acrylic monomer (trade name A-200 available from Shin Nakamura Chemical Co., Ltd.), 20 parts of urethane acrylate (trade name U-2PPA available from Shin Nakamura Chemical Co., Ltd.), 3 parts of phosphate acrylate (trade name PM-2 available from NIPPON KAYAKU Co., Ltd.), and 3 parts of a polymerization initiator (trade name:

NYPER BW available from NOF Corporation), 6 parts of conductive particles (trade name: AUL704, particle diameter: 4 µm, available from Sekisui Chemical Co., Ltd.) and further, as a conductive filler, 12 parts of conductive particles each having a particle diameter of 3 µm and coated with a polymer were uniformly mixed by an ordinary method to prepare an anisotropic conductive adhesive composition. The anisotropic conductive adhesive composition was applied to a releasable polyester film by a bar coater, and dried to produce an Anisotropic Conductive Film (ACF) having a thickness of 14 µm. Evaluation results of a mounted body produced by using the ACF are shown in Table 3.

Example 20

An ACF was produced in the same manner as in Example 1 except that 18 parts of conductive particles each having a particle diameter of 3 µm and coated with a polymer were compounded. Evaluation results of a mounted body produced by using the ACF are shown in Table 3.

Example 21

An ACF was produced in the same manner as in Example 1 except that 24 parts of conductive particles each having a particle diameter of 3 µm and coated with a polymer were compounded. Evaluation results of a mounted body produced by using the ACF are shown in Table 3.

Example 22

An ACF was produced in the same manner as in Example 1 except that 5 parts of carbon black was further compounded. Evaluation results of a mounted body produced by using the ACF are shown in Table 3.

Comparative Example 13

An ACF was produced in the same manner as in Example 1 except that conductive particles each having a particle diameter of 3 µm and coated with a polymer were not compounded. Evaluation results of a mounted body produced by using the ACF are shown in Table 3.

Comparative Example 14

An ACF was produced in the same manner as in Comparative Example 1 except that conductive particles each having a particle diameter of 3 µm and coated with a polymer were not compounded and 5 parts of carbon black was compounded. Evaluation results of a mounted body produced by using the ACF are shown in Table 3.

TABLE 3

|  | Example 19 | Example 20 | Example 21 | Example 22 | Comparative Example 13 | Comparative Example 14 |
| --- | --- | --- | --- | --- | --- | --- |
| Conductive particles (parts by mass) | 6 | 6 | 6 | 6 | 6 | 6 |
| Conductive particles coated with polymer (parts by mass) | 12 | 18 | 24 | 12 | — | — |
| Carbon black (parts by mass) | — | — | — | 5 | — | 5 |
| Evaluation of conduction resistance | A | A | A | A | B | A |
| Evaluation of adhesion strength | A | A | B | A | B | B |
| Evaluation of reaction ratio | B | A | A | A | C | C |

In a case where the conductive particles coated with a polymer were not compounded as in Comparative Examples 13 and 14, the reaction ratio was low. On the other hand, in a case where the conductive particles coated with a polymer were compounded as in Examples 19 to 22, a high reaction ratio was obtained. It is considered that the above resulted from improved heat transfer by infrared light due to the compounding of the conductive particles coated with a polymer.

REFERENCE SIGNS LIST

10 First electronic component
11 First terminal row
20 Second electronic component
21 Second terminal row
30 Anisotropic conductive adhesive
31 Conductive particles
40 Thermal pressurization tool
100, 110, 120 Rigid substrate
101, 111, 121 First terminal row
200, 210, 220 Flexible substrate
201, 211, 221, Second terminal row
300, 310, 320 Anisotropic conductive film
301, 311, 321 Conductive particle
400 Thermal pressurization tool

The invention claimed is:

1. A method for manufacturing a connection structure comprising:
disposing, through an anisotropic conductive adhesive of a thermosetting type including conductive particles and an infrared absorber that is configured to absorb infrared laser light to generate heat, a first electronic component including a first terminal row and a second electronic component including a second terminal row facing the first terminal row;
thermally pressurizing the first electronic component and the second electronic component to sandwich the conductive particles between the first terminal row and the second terminal row; and
irradiating the anisotropic conductive adhesive with infrared laser light to fully cure the anisotropic conductive adhesive in a state where the conductive particles are sandwiched between the first terminal row and the second terminal row, wherein the infrared absorber includes insulating-coated conductive particles having an average particle diameter that is smaller than an average particle diameter of the conductive particles.

2. The method according to claim 1, wherein the thermal pressurization is performed at a temperature of not lower than 50° C. and not higher than 120° C.

3. The method according to claim 1, wherein the full curing step, the anisotropic conductive adhesive is fully cured to obtain a reaction ratio of the anisotropic conductive adhesive of not less than 70%.

4. The method according to claim 1, wherein the anisotropic conductive adhesive has a lowest melt viscosity of not greater than 10000 Pa·s.

5. The method according to claim 1, wherein the infrared absorber further includes carbon black.

6. An anisotropic conductive adhesive comprising:
a film-forming resin having a glass transition temperature (Tg) or a softening point of from 40 to 100° C.;
a polymerizable compound;
a polymerization initiator having a reaction initiation temperature of from 100° C. to 150° C.;
conductive particles; and
an infrared absorber that is configured to absorb infrared laser light to generate heat, the infrared absorber including insulating-coated conductive particles having an average particle diameter that is smaller than an average particle diameter of the conductive particles,
wherein the anisotropic conductive adhesive has a lowest melt viscosity of not greater than 10000 Pa·s.

7. The anisotropic conductive adhesive according to claim 6,
wherein the infrared absorber further includes carbon black.

8. A method for manufacturing a connection structure comprising:
disposing, through an anisotropic conductive adhesive of a thermosetting type including insulating-coated conductive particles that are coated with an electrically insulating resin layer and are configured to absorb infrared laser light to generate heat, a first electronic component including a first terminal row and a second electronic component including a second terminal row facing the first terminal row;
thermally pressurizing the first electronic component and the second electronic component to sandwich the insulating-coated conductive particles between the first terminal row and the second terminal row; and
irradiating the anisotropic conductive adhesive with infrared laser light to fully cure the anisotropic conductive adhesive in a state where the insulating-coated conductive particles are sandwiched between the first terminal row and the second terminal row.

9. The method for according to claim 8, wherein the insulating-coated conductive particles are coated with a thermoplastic insulating resin layer.

10. An anisotropic conductive adhesive comprising:
a film-forming resin having a glass transition temperature (Tg) or a softening point of from 40 to 100° C.;
a polymerizable compound;
a polymerization initiator having a reaction initiation temperature of from 100° C. to 150° C.; and
insulating-coated conductive particles that are coated with an electrically insulating resin layer and are configured to absorb infrared light to generate heat; and
wherein the anisotropic conductive adhesive has a lowest melt viscosity of not greater than 10000 Pa·s.

11. The anisotropic conductive adhesive according to claim 10,
wherein the insulating-coated conductive particles are coated with a thermoplastic insulating resin layer.

* * * * *